United States Patent [19]
Auffret et al.

[11] Patent Number: 4,630,278
[45] Date of Patent: Dec. 16, 1986

[54] INFRARED LIGHT SOURCE INCORPORATING A SEMICONDUCTOR LASER ASSOCIATED WITH MODE SELECTION AND POWER CONTROL MEANS

[76] Inventors: René Auffret, Kernu-Louannec, 22700 Perros-Guirec; René Le Marer, Kerougant Bras, 22730 Tregastel; Yvon Sorel, Kernu-Louannec, 22700 Perros-Guirec, all of France

[21] Appl. No.: 632,729

[22] Filed: Jul. 20, 1984

[30] Foreign Application Priority Data

Jul. 25, 1983 [FR] France ................. 83 12249

[51] Int. Cl.⁴ ............................................. H01S 3/18
[52] U.S. Cl. ........................................ 372/43; 372/32; 372/34; 372/108
[58] Field of Search ................. 372/32, 34, 43, 50, 372/108

[56] References Cited

U.S. PATENT DOCUMENTS 3,793,595  2/1974  Russo et al. .......................... 372/32
4,297,651 10/1981  Dyment et al. .................. 350/96.11
4,375,067  2/1983  Kitamura ............................. 372/43
4,485,475 11/1984  Large et al. .......................... 372/34

OTHER PUBLICATIONS

K. R. Preston, Electronics Letters, vol. 18, No. 25 (1982), pp. 1092-1094.

Primary Examiner—William L. Sikes
Assistant Examiner—Robert E. Wise
Attorney, Agent, or Firm—Michael N. Meller

[57] ABSTRACT

A laser infrared light source is mounted on a mount, a mirror ensuring the mode selection, a photodetector being positioned behind the mirror and connected thereto by an optical fibre and a fibre guiding the useful beam. These element are held by resin supports resting on a base plate.

4 Claims, 5 Drawing Figures

INFRARED LIGHT SOURCE INCORPORATING A SEMICONDUCTOR LASER ASSOCIATED WITH MODE SELECTION AND POWER CONTROL MEANS

BACKGROUND OF THE INVENTION

The present invention relates to an infrared light source incorporating a semiconductor laser associated with mode selection and power control means. It is used in the production of a 1.55 μm source for long-distance optical links.

Optical fibres functioning at 1.55 μm and designed for long-distance optical telecommunications have a very limited attenuation (0.3 to 0.5 dB/km). but have a considerable wavelength dispersion (0.15 ps/nm/km). For long-distance links, e.g. 50 km, it is consequently necessary to use very narrow-spectrum light sources of a few tenths of a nanometer.

However, conventional semiconductor lasers guided by the gain or index have spectral widths of a few nanometers and this width increases further in the case of modulation. In order to reduce this width, use is made of a mode selection procedure, also called optical feedback, enabling the source to be made monofrequency. The principle of this optical feedback is illustrated in FIG. 1.

The laser 1 shown in FIG. 1a is constituted by a Perot-Fabry resonator, whose resonant frequencies are separated by $\Delta\lambda_1$, differing slightly from the quantity: $(\lambda^2/2nL)$ in which $\lambda$ is the wavelength of the source, L the length of the Perot-Fabry resonator and n the effective index of the material.

The gain curve 2 of the amplifying medium selects certain of its frequencies. These frequencies define the longitudinal modes of the resonator (FIG. 1b). A laser is monochromatic or longitudinal monomodal, when only one of its modes is present (generally the highest energy mode).

The addition of an external mirror (FIG. 1a) in the vicinity of the laser and at a distance l of approximately equal to the length L thereof, with a curvature adopting the shape of the wave front of the radiation emitted by the laser, modifies the resonant state of the laser. The resonator constituted by this spherical mirror and the most remote plane mirror has a length L+l. This laser has resonant frequencies (FIG. 1c) spaced by $\Delta\lambda_2$, whose value is close to $$\frac{\lambda^2}{2(nL + l)}$$

The coincidences of the resonances of the main resonator of length L and the auxiliary cavity of length L+l makes it possible, by adjustment of the position of mirror 3, to select one of the modes of the main cavity (FIG. 1d).

For example, for a 200-μm-long laser whose mean effective index is 3.5, the separation between longitudinal modes is 16 Å, i.e. a frequency shift of 214 GHz.

Thus, apart from the mode selection produced by adding mirror 3, there is a reduction in the fineness of the emitted line. This is proportional to the quality factor of the Perot-Fabry resonator, which is itself linked with the reflection coefficient of the mirrors and the length of the resonator. For high reflection coefficients, the width of the resonance peaks of the resonator is approximately equal to:

$$\frac{c(1 - r)}{2\pi nl}$$

in which c is the speed of light and r the reflection coefficient of the mirrors. This width is approximately 100 GHz for the laser referred to hereinbefore.

By increasing the reflection coefficient r by adding an external mirror, it is thus possible to reduce this width in proportion to the length of the optical path. Using an external mirror spaced from the main resonator by a length equal to that of the laser and with a reflection coefficient of the external mirror equal to 80%, the width of the line is substantially reduced and drops to a few GHz.

This mode selection of optical feedback procedure applied to semiconductor lasers is more particularly described in the article by K. R. Preston entitled "Simple spectral control technique for external cavity laser transmitters" published in "Electronics Letters" of 9th Dec. 1982, vol. 18, no. 25, as well as in the article by R. Ries and F. Sporleder entitled "Low frequency instabilities of laser diodes with optical feedback" published in the report of the European Conference on Optical Communications, (ECOC), held in Cannes on Sept. 21-24, 1982.

It is also known that semiconductor lasers can be made power dependent by a current feedback. By measuring the lighting power emitted by the laser, it is possible to form an electrical signal able to control the supply circuit of the laser, so that the power remains constant. Such a procedure is, for example, described in U.S. Pat. No. 4,293,827, granted on Oct. 6, 1981 to D. R. Scifres and R. D. Burnham entitled "Hybrid semiconductor laser detectors. In such a system, a photodetector receives the light emitted by the split rear face of the laser resonator, the front face allowing the useful beam to pass. The photodetector supplies an amplifier, which controls a current source, which supplies the semiconductor element of the laser. Thus, a control loop is formed.

SUMMARY OF THE INVENTION

The present invention proposes to combine these two means (optical selection and power control) in an arrangement having real advantages from the source construction standpoint. It must be borne in mind that in the field of semiconductor lasers for use in optical telecommunications, the stability (mechanical, electrical, optical, thermal, etc.) of the structures is of vital importance and that this stability is often impossible to obtain unless special precautions are taken. However, the present invention provides an original arrangement making it possible not only to combine optical selection and power control, but more particularly to bring about a very robust and highly stable structure.

This arrangement makes use of the selection mirror facing the rear face of the laser and recommends giving the mirror a predetermined transmission, while positioning the photoreceiving device used in the power control loop behind the mirror, the optical coupling between the mirror and the photoreceiving device being ensured by an optical fibre held by a support. Thus, according to the invention, the auxiliary mirror is used both for selecting the mode and as a sampling means for part of the power for control purposes.

Moreover, according to another feature, the useful beam is sampled by the front face of the laser using a second optical fibre held by a support. This double use of the two beams emitted by the laser assumes that the latter has free faces, leading to the use of a special roof-shaped support. All these means rest on a base provided with a temperature regulating device.

According to another feature of the invention all the means forming the source are integrated into the same box or case, as a result of several resin-moulded supports. These supports are put into place, their position is adjusted and they are then fixed with the aid of a resin identical to that of the supports.

BRIEF DESCRIPTION OF THE DRAWINGS

The invention is described in greater detail hereinafter relative to non-limitative embodiments and with reference to the attached drawings, wherein.

DETAILED DESCRIPTION OF THE PREFERRED EMBODIMENTS

Figure 1:
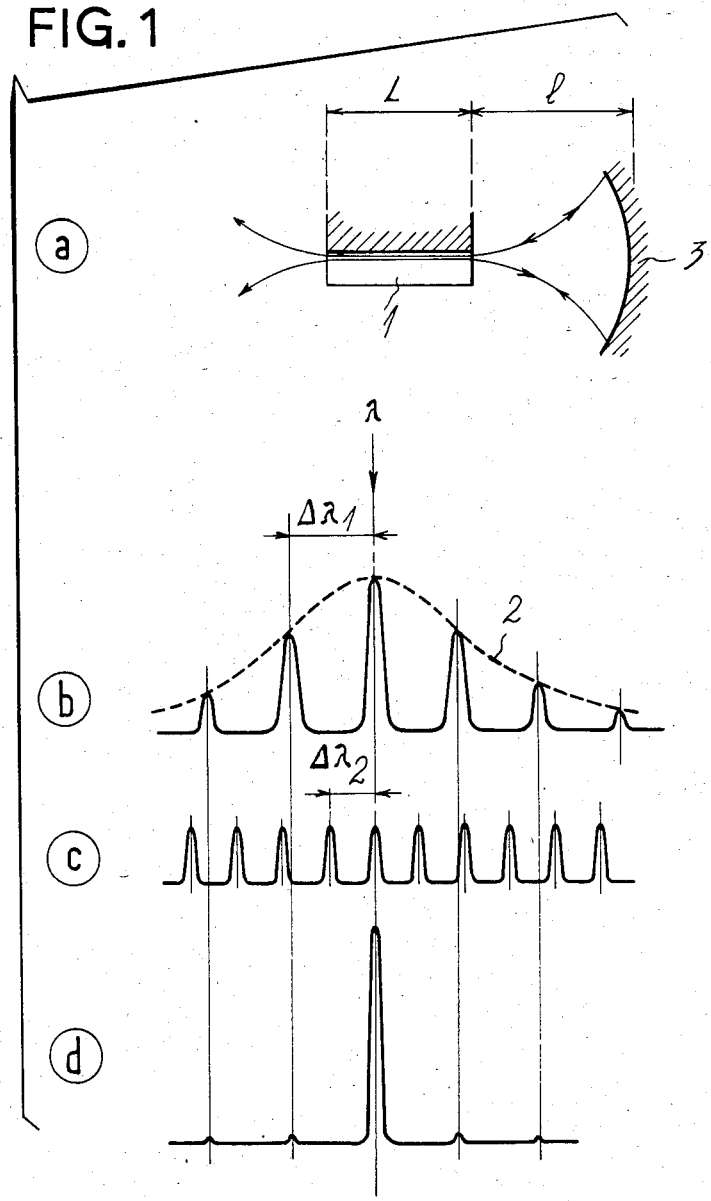
FIG. 1 illustrates, the mode selection principle.
Figure 2:
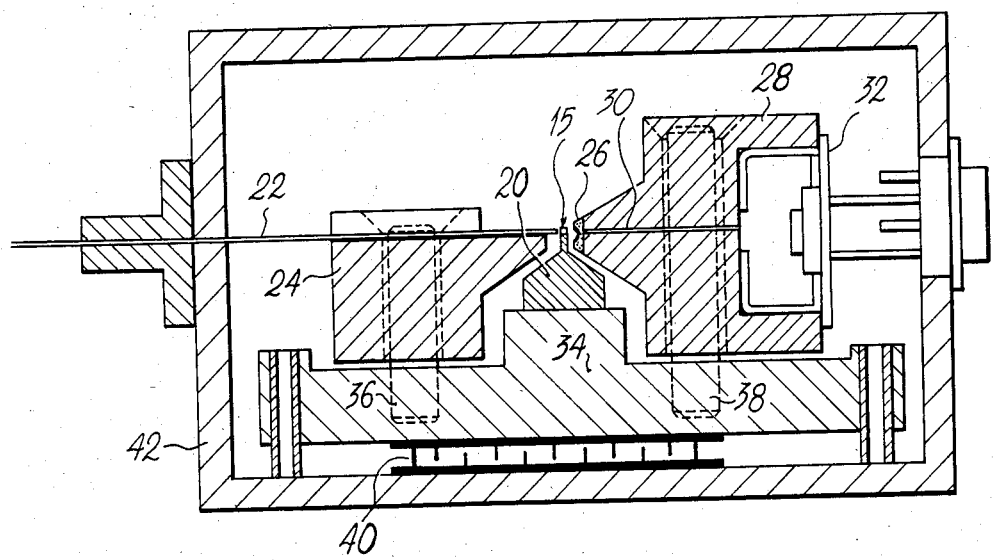
FIG. 2 is a diagrammatic section of a light source according to the invention.

The device shown in FIG. 2 comprises a laser chip 15, mounted at the top of a roof-shaped base 20, an optical fibre 22 held by a support 24, a spherical mirror 26 used for mode selection purposes, this mirror being integral with a support 28, an optical fibre 30 positioned behind the mirror and a photodetector 32. The assembly rests on a base plate 34, which engages calibrated rods 36, 38 for holding supports 24 and 28 in place. Below the base plate a thermoelectric module 40 is provided. The assembly is contained in a box or case 42.

The beam supplied by such a source is guided by fibre 22. In conventional manner, the laser has two reflecting faces (generally split faces) and emits two beams transversely to the ridge of the roof formed by the mount.

Figure 3:
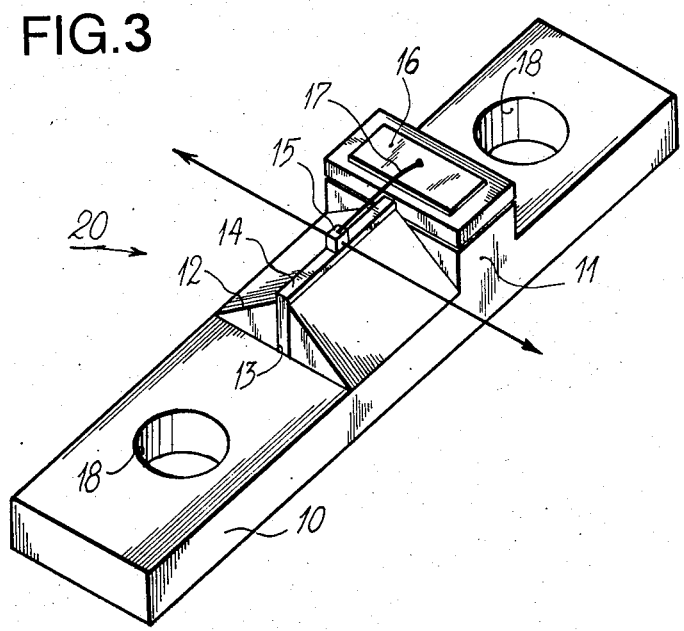
FIG. 3 shows a laser mount used in the invention.
Figure 4:
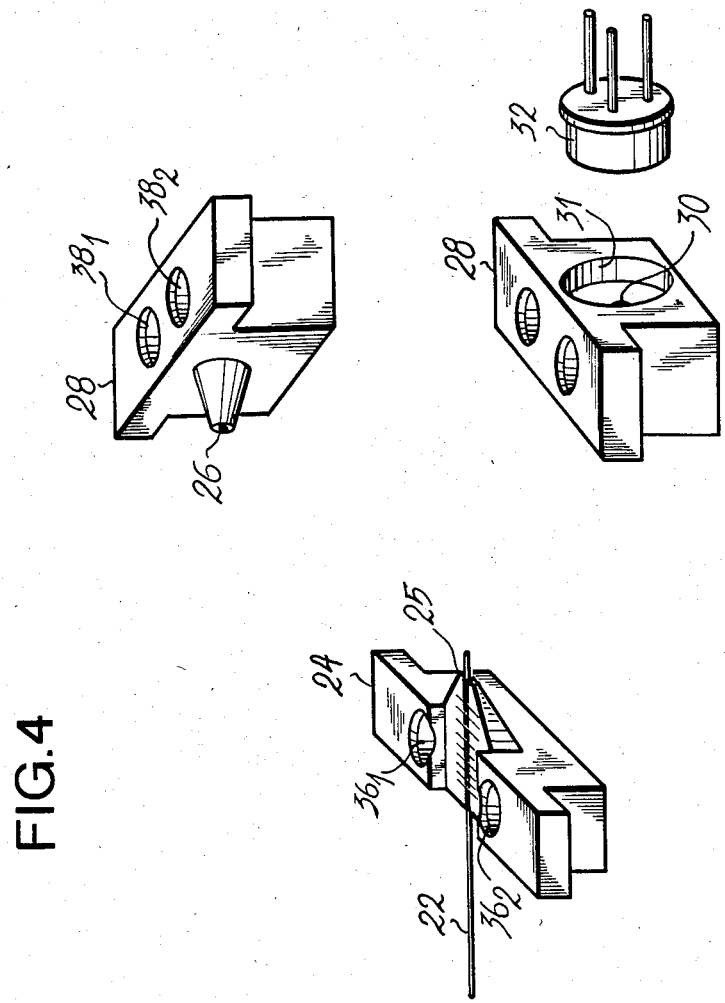
FIG. 4 shows various elements of the source.

FIGS. 3 and 4 show the various subassemblies of this device in detail. The mount shown in FIG. 3 comprises a monoblock metal support 10 having a prismatic part 12 formed by two planes which are inclined relative to the plane of symmetry of the assembly. This prismatic part has a slot 13 made in the plane of symmetry. A metal strip 14 is brazed in the slot. This strip has a polished upper edge which forms a ridge for receiving the laser chip 15. The length of the chip is equal to the thickness of the strip. The laser radiation is consequently transversely directed. The mount also has a base 11, to which is brazed a parallelepipedic interconnection plate 16 connected to the laser chip 15 by a lead 17. The support can have fixing holes 18.

The prismatic shape 12 frees the laser chip and the mirrors without destroying the thermal contact remaining over the entire bottom of the laser chip.

Such a mount can be produced in the following way. The support is obtained by milling and grinding a drawn copper part or ring. The base 11 and the prismatic part 12 are obtained. Slot 13 is formed by sawing on a milling machine with the aid of a sitting saw, the width of which is such that the desired width is obtained in a single pass. This width is equal to the thickness of the strip to be fitted, plus 30 to 40 μm. Deburring then takes place, followed by cleaning with chlorinated or fluorinated solvents in an ultrasonic tank.

The strip is preferably made from copper, in the same way as the support. Metal bands are rolled and then cut to the correct length with the aid of a slitting saw. Following cutting, the strips are cleaned by means of a chlorinated or fluorinated solvent. Each strip is then ground on three faces and then undergoes polishing on the face for receiving the laser chip.

The interconnection plate can be constituted by a fritted alumina substrate covered with a conductive coating used for the interconnection and produced by screen process printing of a glass-free gold paste. The inner face for fixing to the base of the support is covered with a coating obtained with the aid of a silverpalladium paste.

The strip is fixed by soft brazing in the slot made in the support. The filler alloy is chosen as a function of its melting point and the thermal performance characteristics required of the mount. For example, in the case of performance characteristics of 160° C., it is possible to use an alloy formed from 62.5% tin, 36% lead and 1.5% silver, whose melting point is 179° C. In the case of thermal performance characteristics of 200° C., it is possible to use a 95% tin—5% antimony alloy, whose melting point is 240° C.

FIG. 4 shows supports 24 and 28, the first having a centering grid 25 in which is placed fibre 22. The support 24 is made by moulding with the aid of a resin. It is fixed in base plate 34 by calibrated anchoring rods 36, which are inserted in follow bores $36_1$, $36_2$. These rods are previously fixed to the base plate 34. The resin used for forming support 24 is also used for fixing the support to the rods. The clearance necessary for the operation is approximately 1/10 mm. The shrinkage of these resins is 5/1000, i.e. a displacement of approximately one-half micron can be obtained during polymerization, which leads to coupling losses of 1 to 2 dB.

The same procedure is used for the mirror support 28. It is made from resin and fixed to base plate 34 with the aid of anchoring rods, which are inserted in bores $38_1$, $38_2$. These rods are also immobilized by the resin used for making the support.

For example, the mirror is a spherical cap with a diameter of 580 μm and made from pure resin. Its radius of curvature is as close as possible to that of the wave front of the laser. The mirror receives a 100 Å cold coating, permitting a 70% reflection at the considered wavelength. In its rear part, support 28 also has a cavity 31 able to receive photodetector 32.

The relay fibre 30 can have a 300 μm core diameter. It is embedded in support 28 between the surface of the photodetector and the mirror. It ensures the transfer of the light from the rear face of laser 15 towards the photodetector 32 across mirror 26. The pure resin from which the mirror is made has an index of 1.5 and it is transparent at the wavelength of 1.55 μm. The thus collected power is approximately 50 μm. It is adequate for bringing about the power control by the bias of the laser supply current.

The thermoelectric module 40 of large surface area (e.g. 3×3 cm) covers part of the base plate 34. It is associated with a heat sensor positioned in the vicinity of the laser mount and makes it possible to bring about heat regulation within the box with an accuracy of approximately 0.2° C. following balancing for a temperature ranging between 15° and 20° C. The assembly of the elements is integrated in box 42 acting as a radiator for the thermoelectric element.

Figure 5:
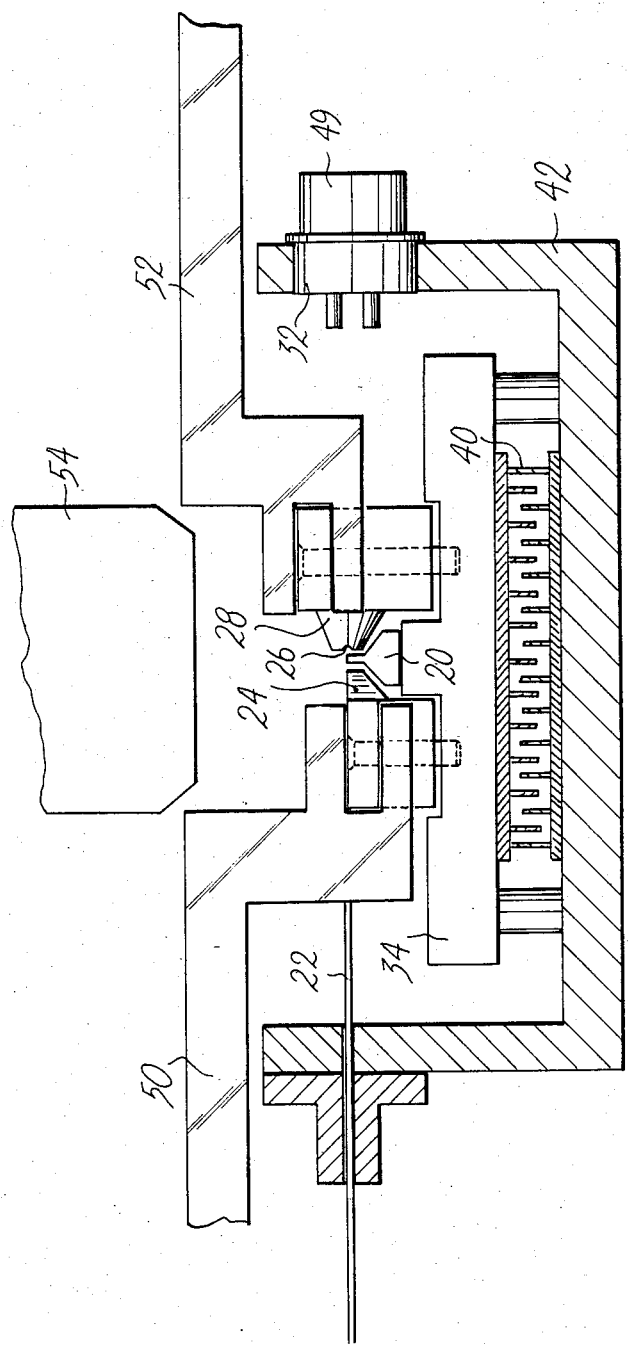
FIG. 5 shows the manner of fitting these various elements.

FIG. 5 is an overall view of the box on an assembly bench. A manipulating arm 50 grips the fibre support 24, which is micromanipulated in front of the emissive zone of the laser, so as to bring about an optimum coupling. The support is then immobilized by adding resin around the anchoring rods, this resin being the same as that used for producing the support. In the same way, an arm 52 grasps the mirror support 28 and places it behind the laser. The same resin is used for fixing purposes. All the operations are controlled by the operator by means of a magnifying optical instrument 54.

What is claimed is:

1. A light source comprising:
   (a) a semiconductor laser with a front face and a rear face, said faces being separated by a distance L, said laser emitting a first beam through said front face and a second beam through said rear face,
   (b) a roof-shaped mount having a ridge for supporting said laser, said laser being supported such that said first and second beams are transversely directed with respect to a longitudinal axis of said ridge,
   (c) a first support having at least one bore,
   (d) a first optical fiber having an input face, said first optical fiber being affixed to said first support such that said input face confronts said front face of said laser,
   (e) a second support having at least one bore,
   (f) a mode selection means arranged to confront said rear face of said laser, said mode selection means being affixed to said second support such that the distance l separating said mode selection means and said rear face is on the order of L, said mode selection means comprising a partially transmissive concave mirror,
   (g) a second optical fiber having an input face and an output face, said second optical fiber being affixed to said second support such that said input face is located behind said mirror,
   (h) a photodetector having a photodetecting surface, said photodetector being affixed to said second support such that said photodetecting surface confronts said output face of said second optical fiber,
   (i) a base plate having a longitudinal axis disposed substantially parallel to the directions of said first and second beams and to said first and second optical fibers, said roof-shaped mount, said first support and said second support being mounted on said base plate, said base plate having a plurality of calibrated anchoring rods arranged to engage the bores of said first and second supports, and
   (j) a bonding material for affixing said rods in said support bores.

2. A light source according to claim 1, wherein said bonding material and said first and second supports comprise a predetermined resin.

3. A light source according to claim 1, wherein said base plate comprises a thermoelectric module adapted to be connected with temperature regulation means.

4. A light source according to claim 1, wherein the shape of said mirror conforms to the shape of the wavefront defined by said second beam.

* * * * *